United States Patent
Atsumi et al.

[11] Patent Number: 5,986,940
[45] Date of Patent: Nov. 16, 1999

[54] SEMICONDUCTOR INTEGRATED CIRCUIT DEVICE WITH A CONSTANT CURRENT SOURCE

[75] Inventors: Shigeru Atsumi, Yokohama; Tadayuki Taura, Zushi, both of Japan

[73] Assignee: Kabushiki Kaisha Toshiba, Kawasaki, Japan

[21] Appl. No.: 09/030,778

[22] Filed: Feb. 26, 1998

[30] Foreign Application Priority Data

Feb. 27, 1997 [JP] Japan ..................................... 9-044173

[51] Int. Cl.$^6$ .................................................. G11C 11/34
[52] U.S. Cl. .................................. 365/185.3; 365/189.07
[58] Field of Search ................................ 365/185.3, 226, 365/189.07

[56] References Cited

U.S. PATENT DOCUMENTS 5,450,361  9/1995  Iwahashi et al. ................... 365/189.07

Primary Examiner—David Nelms
Assistant Examiner—M. Tran
Attorney, Agent, or Firm—Banner & Witcoff, Ltd.

[57] ABSTRACT

The semiconductor integrated circuit device includes memory cells the conductive state of which is changed in accordance with the data stored therein when selected, a sensing circuit having sense nodes for sensing the data stored in the memory cell. A constant current source according to the present invention supplies a current corresponding to the leak current to be detected on the sense node, as a load current in a leak current check where the memory cell is set in a non-selected state and the leak current flowing through the memory cell is detected. Accordingly, the device can ensure a large reading margin even in checking the leak current flowing through the memory cell, prevent the increase in total area of the integrated circuit, and prevent the alternate current characteristics in the ordinary data reading from being adversely affected.

34 Claims, 4 Drawing Sheets

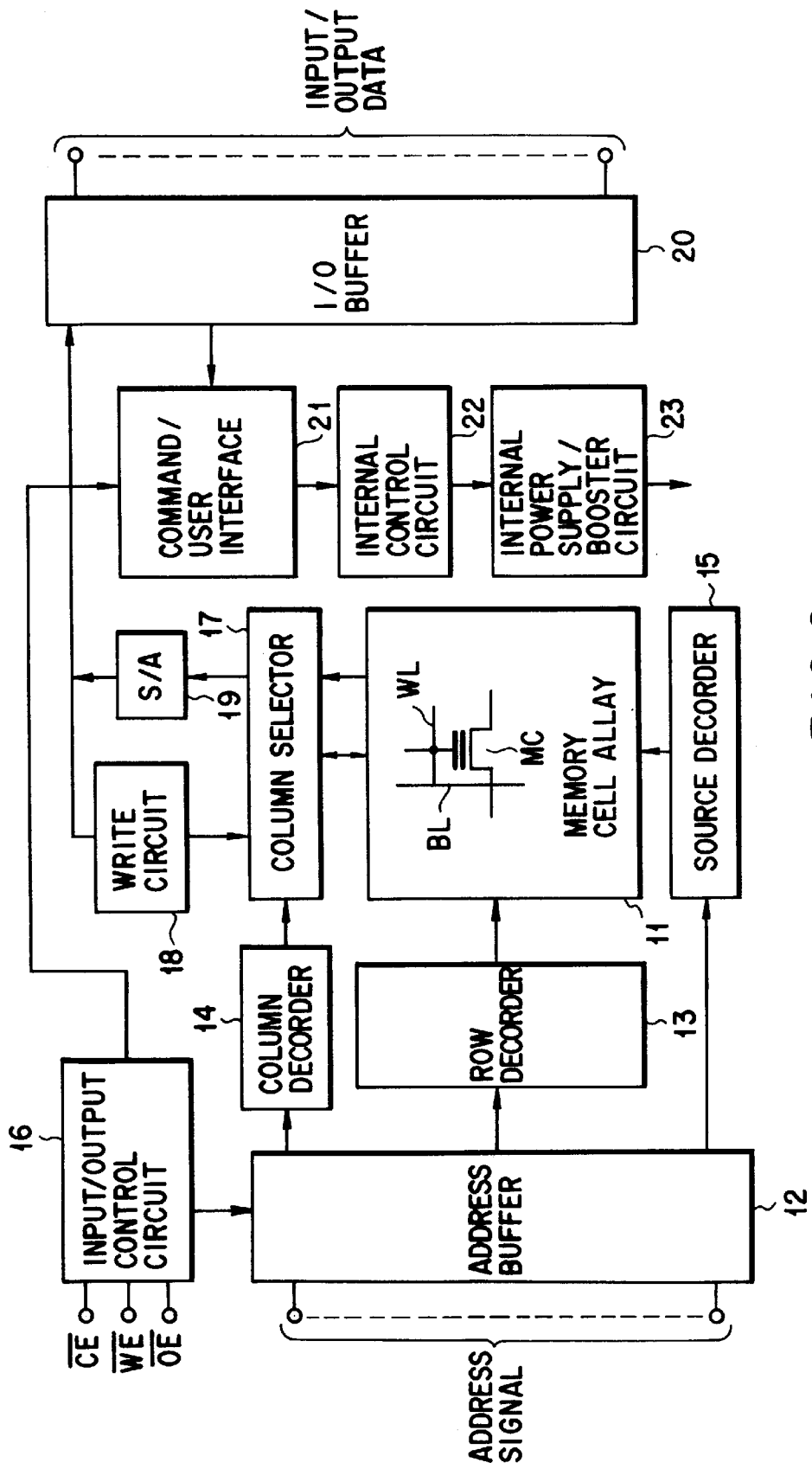
F I G. 2

SEMICONDUCTOR INTEGRATED CIRCUIT DEVICE WITH A CONSTANT CURRENT SOURCE

BACKGROUND OF THE INVENTION

The present invention relates to a semiconductor integrated circuit device for electrically erasing data in unit of a plurality of memory cells (blocks), more particularly to a flash EEPROM (Electrically Erasable Programmable Read-Only Memory) having a function of determining the presence of the overerased memory cells by monitoring the leek current from the column after the data erasing operation.

The memory cells constituting the flash EEPROM are each formed of a non-volatile transistor memory including a floating gate and a control gate forming a stack structure. In writing the data in the flash EEPROM, a write voltage is applied to the control gate and drain of the memory cell to generate hot electrons in a channel such that the hot electrons are injected into the floating gate.

While, in erasing the data written in the flash EEPROM, the source of the memory cell is applied with a high voltage to generate a high electric field between the source and the floating gate. With this high electric field, the electrons caught by the floating gate are discharged to the source by the tunnel effect, and the data stored in the flash EEPROM is erased.

In erasing the data written in the flash EEPROM, the overerasing, the phenomenon that the threshold voltage of the memory cell turned to have a negative polarity. The overerased memory cell (hereinafter referred to as "overerased cell") is constantly turned on even in the non-selected state. Accordingly, when the bit line to which the overerased cell is connected is connected to the memory cell which is turned off and stores "0" data, the "0" data cannot be read correctly even if the "0" data memory cell is selected.

In order to prevent the overerasing, the erasing method called as the intelligent erasing method wherein the erasing operation and the verifying operation are repeatedly performed to finish the erasing operation when the threshold voltage of the memory cell the data stored in which is erased latest is decreased lower than a predetermined voltage.

While, after the erasing operation, the threshold voltages of the memory cells in the flash EEPROM are distributed around a range wider than 2V, which is quite larger than 1V, the distribution range of the threshold voltages of the devices the data stored in which is erased with use of ultra violet ray. With such a large distribution range of the erasing threshold voltages, the lower limit of the reading voltage therein cannot be easily decreased. This is the bottleneck in decreasing the reading voltage. Further, the variation in the threshold voltages of the memory cells, which is generated in the manufacturing process, is thought to increase in future as a result of the reduction of the memory cell in size. In consideration of the above, the variation in the threshold voltages needs to be decreased.

In order to overcome the overerasing problem causing the variation in the threshold voltage, the process called as the compaction where it is checked whether of not any memory cell is overerased, and the threshold voltage of the overerased cell is turned to have a positive polarity needs to be performed. The compaction is performed by applying the write voltage to the drain of the overerased cell after erasing the data stored therein, to inject abalanche hot carriers into the overerased cell.

With this method, the threshold voltage of the overerased cell can be turned to have a positive polarity by applying the positive voltage to the overerased cell. It is no more than 100 ms enough to turn the threshold voltage of the overerased cell to have a positive polarity.

The above-mentioned compaction process is performed by simultaneously applying the control gates and the sources of the memory cells with a ground voltage (Vg=0V) and applying the drain with a positive voltage, and thus cannot be performed selectively for respective memory cells. Accordingly, the compaction process is usually performed simultaneously for a unit of memory cells connected to one or a plurality of columns (bit lines). In the compaction process, the overerased cell checking operation is performed by measuring the amount of the leak current from each columns in the state where all the word lines are grounded. The leak current amount of about $1\mu$ to $5\ \mu A$ needs to be measured in this time, to find the overerased cell.

FIG. 1 schematically shows the conventional reading circuit in a flash EEPROM.

In this drawing, a plurality of memory cells MC in the same column are connected to a bit line BL at their drains. Each memory cell has a floating gate, a control gate, and source and drain. By injecting electrons into the floating gate, the threshold voltage of the memory cell is changed, thereby electrically writing (programming) data in the memory cell and electrically erasing data therefrom. In the writing operation, the data stores in the memory cells are electrically erased.

The bit line BL is connected, via a MOS transistor 91 for selecting a column, to a sense node N1 which is one of the sense nodes of a differential amplifier 92 for sensing data. The sense node N1 is connected to a load circuit 93 which is arranged between a power supply voltage $V_{DD}$ and the sense node N1.

A reference line RL is connected to a reference current source 94. The reference line RL is also connected, via a MOS transistor 95 arranged so as to correspond to the MOS transistor 91, to a sense node N2 which is the other one of the sense nodes of the differential amplifier 92. The sense node N2 is connected to a load circuit 96 which is arranged between a power supply voltage $V_{DD}$ and the sense node N2.

The memory cells MC is constituted such that only selected one of the control gates thereof is applied with a high level voltage in a read mode. The other memory cell are applied with a low level voltage. In a leak current check mode, all the memory cells are applied with the low level voltage.

Assume that the load circuit 96 as the load for the reference line is denoted as R1 and the load circuit 93 as a load for the bit line is denoted as R2, and the current flow from a reference current source 94 is denoted as I1, and the current flowing through the bit line BL is denoted as I2. Then, the potential (a sense potential) at the sense node N1 equals to the potential (a reference potential) at the sense node N2 when the relationship among them can be represented as R1·I1=R2·I2.

Accordingly, when the relationship is represented as I1<(R2/R1)·I2, it is determined that no leak current flows from the bit line BL. When the relationship is represented as I1>(R2/R1)·I2, it is determined that a leak current flows from the bit line BL.

According to the conventional device, the level of the current differs in a read mode and in a leak current check mode: when the current value in a read mode is set at $20\ \mu A$ and the that in a leak current check mode is set at $1\ \mu A$, for example. In this time, the value of R1 is varied such that the relationship as R1 (in a read mode)>R1 (in a leak current check mode) can be obtained. By setting the ratio of the above-represented values of R1 as 20, the amounts of the currents differentiated by 20 times can be determined.

However, in case of adopting a method in which the value of the resistance value R1 is set to be small one in a leak current check mode in the conventional data reading circuit, the signal amplitude in the bit line BL is extremely decreased, with the result that the reading margin is also decreased.

In the above case, the resistance value R1 is set small in a leak current check mode. In contrast, the resistance value R2 may be increased by 20 times to differentiate the resistance value. In this case, the signal amplitude in the bit line BL can be sufficiently maintained in a leak current check mode as in a read mode. However, a load element is constituted of a MOS transistor, in general. The MOS transistor having a large resistance value has a large area. The increase in area in this portion will increase in total area of the circuit, and the parasitic capacitance of the reference line connected to the sense node of the differential amplifier will be increased thereby. As a result, the alternate current characteristics in a read mode may be adversely affected.

BRIEF SUMMARY OF THE INVENTION

Accordingly, it is an object of the present invention to provide a semiconductor integrated circuit device capable of obtaining a large reading margin even in checking a leak current flowing in memory cells, and preventing the increase in the total area of the device and the adverse effect to the alternate current in the ordinary data reading.

According to one aspect of the present invention, there is provided a semiconductor integrated circuit device comprising: a memory cell a conductive state of which is changed in accordance with data stored in the memory cell when selected; a sensing circuit having a sense node, for sensing the data stored in the memory cell; and a constant current source for supplying to the sense node a current corresponding to a leak current flowing through the memory cell in a leak current check where the memory cell is set in a non-selected state and the leak current is detected.

According to another aspect of the present invention, there is provided a semiconductor integrated circuit device comprising: a memory cell a conductive state of which is changed in accordance with data stored in the memory cell when the memory cell is selected; a differential sensing circuit having first and second sense nodes, for sensing the data stored in the memory cell; a load circuit for supplying to the first sense node a load current used for reading data in a first mode; a current source for supplying to the first sense node a current smaller than the load current in a second mode; a circuit for causing to flow from the first sense node the current smaller than the load current in the first mode; and a circuit for setting the second sense node to a reference potential.

According to still another aspect of the present invention, there is provided a semiconductor integrated circuit device comprising: a memory cell a conductive state of which is changed in accordance with data stored in the memory cell when selected; a sensing circuit having a sense node, for sensing the data stored in the memory cell; a MOS transistor used for dividing potential and connecting a bit line coupled to the memory cell with the sense node of the sensing circuit; a leak current source for causing to flow from the sense node a leak current in data reading where the data stored in the memory cell is read; and a bias generating circuit for supplying a bias voltage to a gate of the MOS transistor and the leak current source.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a block diagram showing the constitution of the inside of the chip of the semiconductor integrated circuit device according to an embodiment of the present invention, which is applied to a flash EEPROM;

DETAILED DESCRIPTION OF THE INVENTION

Figure 1:
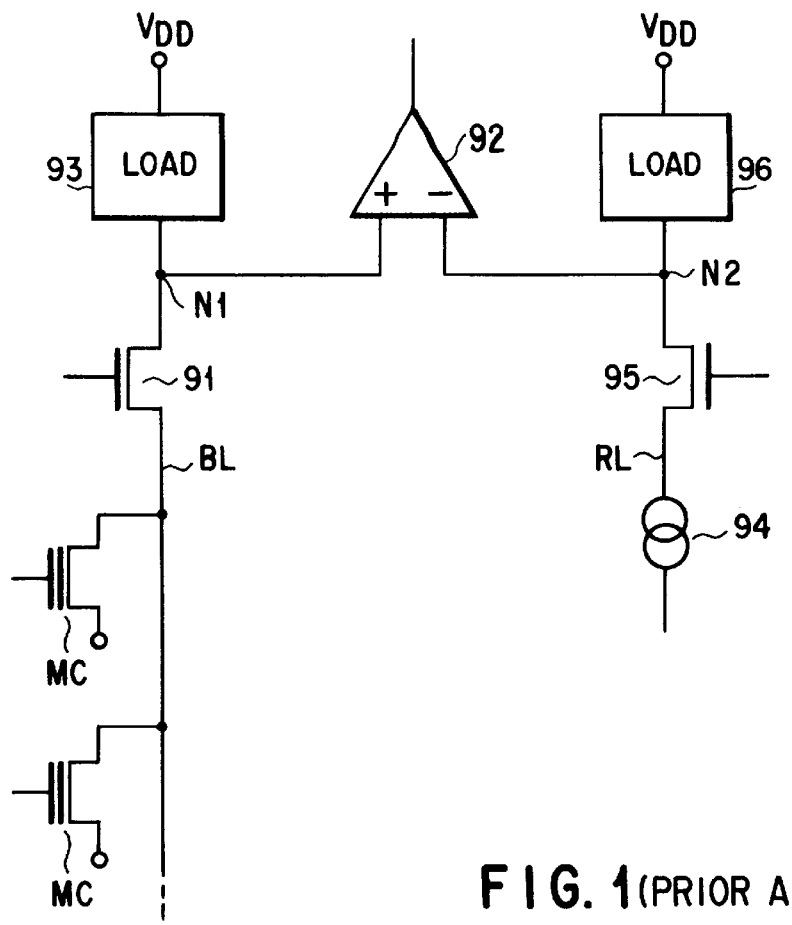
FIG. 1 is a circuit diagram showing the schematic constitution of the conventional data reading circuit of a flash EEPROM.

A preferred embodiment of the present invention will now be described with reference to the accompanying drawings.

FIG. 2 is a block diagram showing the constitution of the inside of the chip of the semiconductor integrated circuit device according to the embodiment of the present invention, which is applied to a flash EEPROM.

A memory cell array 11 in this drawing includes a plurality of bit lines BL and word lines WL (to simplify the drawing, only one bit line and word line are shown), and a plurality of memory cells MC (only one thereof is shown in the drawing) each of which has a floating gate, a control gate, and a source and a drain. By injecting electrons into the floating gate to write a program therein, the electrons caught by the memory are discharged from the floating gate to erase the data stored in the memory.

The control gate of each memory cell MC is connected to one of the word lines, and the drain of the memory is connected to one of the bit lines. The source of each memory cell MC is connected to a common source line (not shown) in unit of a bit line, a word line, or a block.

An address buffer 12 receives an address signal from the outside to generate an internal address signal. The internal address signal generated by the address buffer 12 is supplied to a row decoder 13, a column decoder 14, and a source decoder 15.

The I/O control circuit 16 receives from the outside a chip enable signal/CE, a write enable signal/WE, and an output enable signal/OE ("/" indicates that the signal is inverted), to generate various control signals for controlling internal circuits in accordance with the above input signals.

For example, the control signal based on the chip enable signal/CE is supplied to the address buffer 12. In the address buffer 12, the operation for generating internal address signals is performed in accordance with the control signal. The control signal based on the output enable signal/OE is supplied to an I/O buffer (described later). In the I/O buffer, the operation for outputting data is enabled. The control signal based on the write enable signal/WE is supplied to a write circuit (described later). In the write circuit, the operation for writing data is enabled.

The row decoder 13 selects one of the word lines WL in the memory cell array 11 in accordance with the internal address signal (the internal row address signal).

A column selector 17 selects one of the bit lines BL in the memory cell array 11 in accordance with the decode output from the column decoder 14.

The source decoder 15 selects one of the source lines in accordance with the internal address signal and supplies a predetermined voltage to the selected source line.

The write circuit 18 supplies data to selected memory cells in the memory cell array 11 in writing data in order to write data in the selected memory cells.

A sense amplifier circuit (S/A) 19 operates in a read mode and in a leak current check mode: in a read mode, senses the data output from the selected memory cell in the memory cell array 11, and in a leak current check mode, checks the presence of the leak current in the selected one of the bit lines.

A I/O buffer 20 supplies the data received from the outside to the write circuit 18 in writing data, and outputs the data sensed by the sense amplifier circuit 19 to the outside in a read mode. The I/O buffer 20 is also supplied with command data for setting the various modes of operation: a data writing mode; a data erasing mode; and a data reading mode.

The I/O buffer 20 is connected to a command/user interface circuit 21. The command/user interface circuit 21 is supplied with the control signal output from the I/O control circuit 16. The command/user interface circuit 21 receives the command data output from the I/O buffer 20 when the write enable signal/WE is activated. The output of the command/user interfaces circuit 21 is supplied to an internal control circuit 22.

The internal control circuit 22 is supplied with the command data by the command/user interface circuit 21. The internal control circuit 22 generates an internal control signal in accordance with the command data. The internal control signal is supplied to an internal power supply/ booster 23.

The internal power supply/booster circuit 23 receives an external power supply voltage to generate an internal power supply voltage, and generate a positive/negative high voltage with use of a charge pump. The voltage generated by the internal power supply/booster circuit 23 is distributed to the circuits arranged on the same chip. For example, the positive high voltage is applied to the row decoder 13, the source decoder 15 and the like, and the negative high voltage is applied to the row decoder 13 and the like.

The operation of the flash EEPROM having the above-mentioned constitution will be described below. In reading/ writing/erasing of data, the address buffer 12 is supplied with an address signal for selecting desired memory cells. In writing data, the I/O buffer 20 is supplied with data to be written in the memory cells, and then desired memory cells MC are selected in accordance with the address signal supplied to the address buffer 12.

Figure 3:
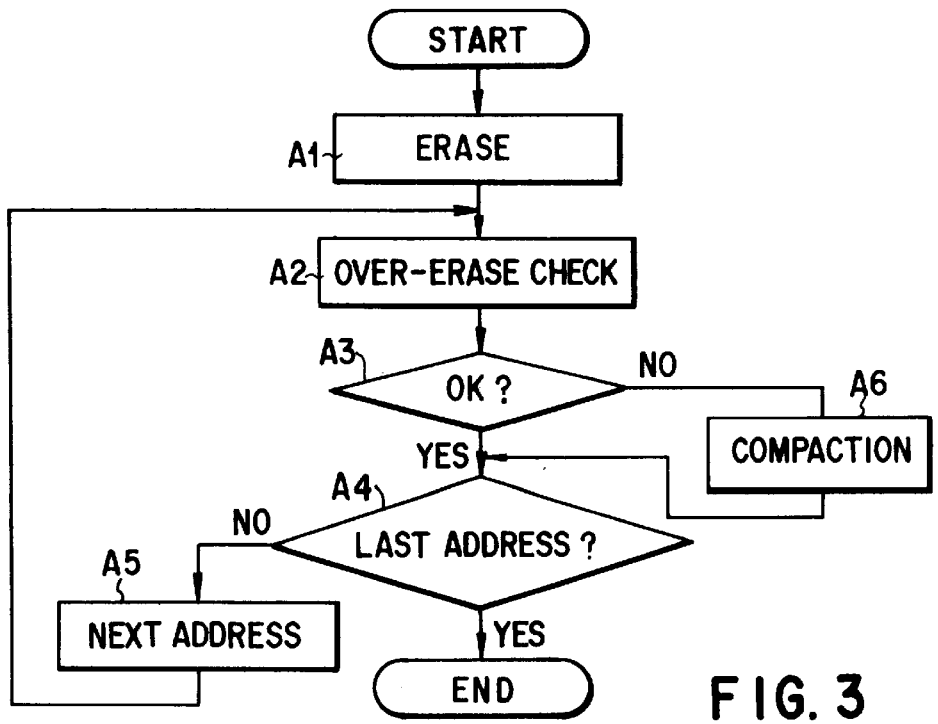
FIG. 3 is a flow chart showing the procedure of the data erasing operation in the flash EEPROM shown in FIG. 2.

FIG. 3 is a flow chart showing the procedure of the data erasing operation as one mode of operation.

When an erasing command is input into the command/ user interface circuit 21 through the I/O buffer 20, the internal control circuit 22 controls the internal power supply booster circuit 23 to generate a voltage for erasing data and supply it to the row decoder 13 or the like.

In this manner, when the erasing operation starts, the data is erased in a unit, generally in unit of one of a plurality of blocks obtained by dividing the memory cell array 11 (step A1 in FIG. 3). In erasing data, the control gate of the memory cell MC is applied with a voltage of −7V, for example, and the source is applied with a voltage of 6V for example, in order to set the drain of the memory in an open state. Although the step A in FIG. 3 does not touch on detailed processes for the data erasing, it is to be noted that the control for repeatedly executing both of the erasing operation and its checking operation is performed until all targeted memory cells are sufficiently erased.

Next, a checking operation is performed to check whether or not an overerased cell exists in the memory cells corresponding to the initial column address of the block in which the data erasing has performed (step A2). The checking operation is performed by checking the presence of the leak current in the bit line, as mentioned before. If no overerased cell exists in the memory cell (YES in step A3), it is determined next whether or not the memory cells correspond to the last column address (step A4). If the memory cells correspond to the last column address, the data erasing operation is determined to be finished. If the memory cells do not correspond to the last column address, another memory cells corresponding to the next column address will be checked (step A5) in the same manner as the above.

If an overerased cell is found in the checking (NO in step A3), the process called as compaction wherein the threshold voltage of the overerased cell is turned to have a positive polarity is performed (step A6). The compaction is performed using a method wherein the write voltage is applied to the drain of the overerased cell in the state that the control gate of the overerased cell is grounded such that avalanche hot carriers are injected into the overerased cell.

After the compaction is performed, the memory cells correspond to the last column address (step A4). If the memory cells correspond to the last column address, the data erasing operation is finished. If not, the memory cells corresponding to the next column address will be checked (step A5) to check the occurrence of the overerasing.

Note that, after the compaction, the following process may be carried out. That is, it may be checked to see if a memory cell in an insufficiently erased state exists. If the memory cell in an insufficiently erased state exists, the control may be again returned to the step A1 of erasing data.

Figure 4:
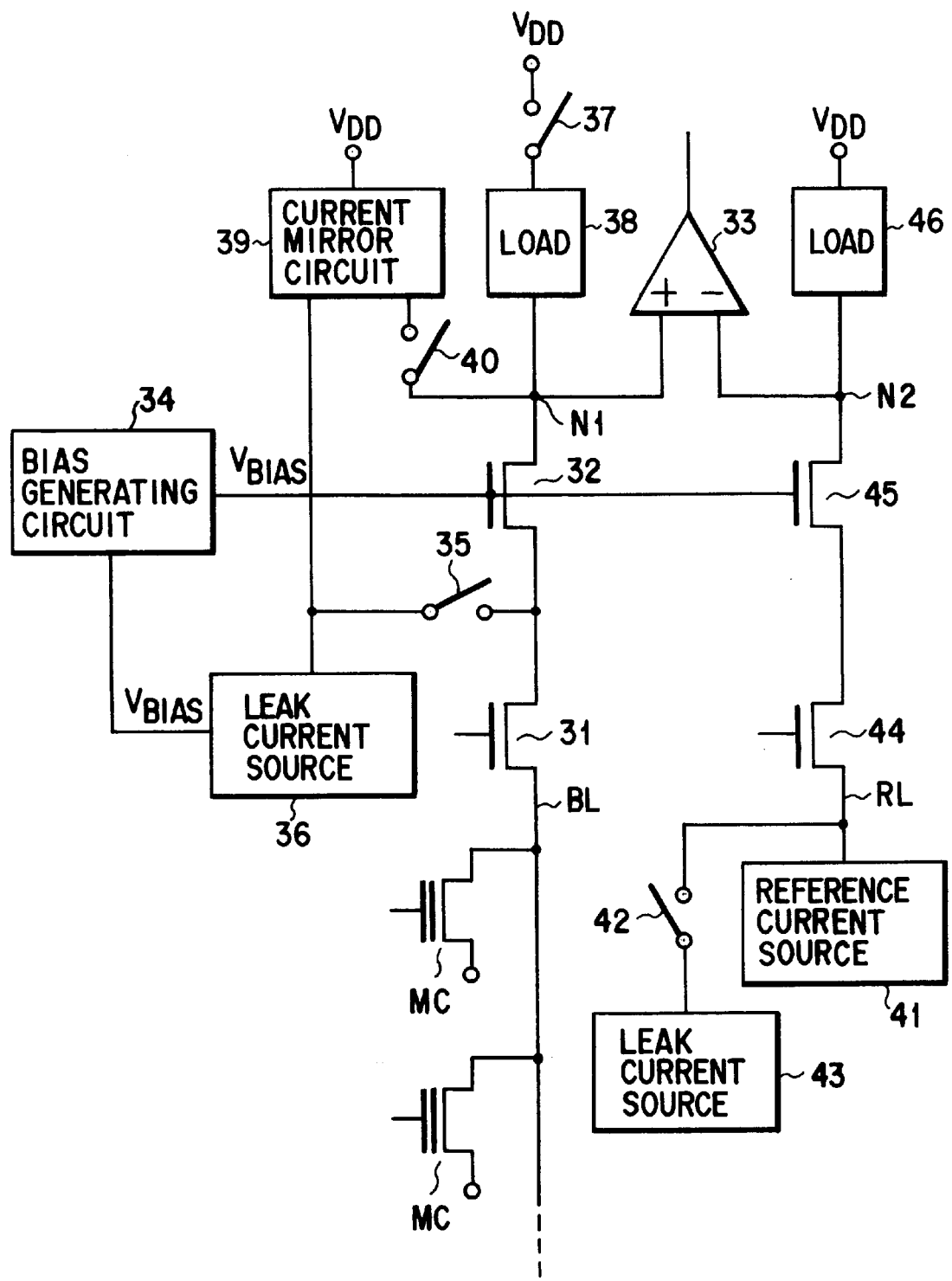
FIG. 4 is a circuit diagram showing the schematic constitution of the data reading circuit of the flash EEPROM shown in FIG. 2.

FIG. 4 shows the schematic constitution of the data reading circuit of the flash EEPROM shown in FIG. 2.

In this drawing, the drains of the memory cells MC arranged in the same column of the memory cell array 11 are connected in common to the bit line BL.

The bit line BL is connected to the sense node N1 of the differential amplifier 33 arranged in the sense amplifier circuit 19 for sensing data, through a MOS transistor 31 in the column selector 17 for selecting a column and a MOS transistor 32 for dividing potential, which are connected in series. The gate of the MOS transistor 32 is applied with a bias voltage $V_{BIAS}$ which is generated by a bias generating circuit 34. The bit line BL is connected to a leak current source 36 through a switch 35.

The leak current source 36 is a constant current source which supplies a current corresponding to the leak current flowing in a leak current check mode. The value of the current is set at 1 μA, for example. The value can be selected from the range of 1μ to 5 μA.

The power supply voltage $V_{DD}$ is connected to one end of the switch 37. The other end of the switch 37 is connected to a load circuit 38 which is arranged between the sense node N1 and the switch 37 and is used in reading data from the memory cell MC.

The current generated by the leak current source 36 is supplied to the current input node of the current mirror circuit 39. The current mirror circuit 39 is connected to the power supply voltage $V_{DD}$, and can cause to flow the current output node a current equal to the current supplied to the current input node. The current output node of the current mirror circuit 39 is connected to a switch 40 arranged between the sense node N1 and the current output node.

The reference line RL is connected to a reference current source 41. The reference current source 41 outputs through the reference line RL the current corresponding to the cell current flowing through the memory cell which stores "1" data and is turned on in a read mode. The value of the current for reading data is set at 20 μA, for example, as mentioned above.

The reference line RL is connected to the leak current source 43 via the switch 42. The leak current source 43 causes to flow a current having a current value (1 μA) equivalent to the leak current generated by the leak current source 36. The leak current source 43 and the switch 42 need not necessarily provided to the circuit, and may be omitted.

Further, the reference line RL is connected to the sense node N2 of the differential amplifier 33 via the MOS transistors 44 and 45 which are connected in series and equivalent to the MOS transistors 31 and 32, respectively. The sense node N2 is connected to a load element 46 arranged between the power supply voltage $V_{DD}$ and the sense node N2.

In such a constitution, when the overerasing check is performed after erasing data in a memory cell in a block, the switches 35, 42, and 37 are opened, and the switch 40 is closed. In this time, the bias voltage $V_{BIAS}$ is applied to the gates of the MOS transistors 32 and 45, and thus the MOS transistors 32 and 45 are in the ON state. Further, the MOS transistor 31 for selecting a column and the MOS transistor 44 which is arranged on the side of a reference line so as to correspond to the MOS transistor 31 are turned on. The bit line BL is connected to the sense node N1 of the differential amplifier 33, and the reference line RL is connected to the sense node N2. In the overerasing check, the control gates (word lines) of all the memory cells MC are applied with a ground potential.

In this time, the switch 37 is opened and the switch 40 is closed, as described above, and thus the sense node N1 is not supplied with the negative current from the load circuit 38, but is supplied with the current output from the current mirror circuit 39. The current value of the current mirror circuit 39 is set at 1 μA in this embodiment, and thus the value of the current flowing into N1 through the switch 40 is also 1 μA. In this time, data stored in all the memory cells MC connected to the bit line BL have been erased in advance, and thus the control gates thereof are applied with a ground potential. In this condition, no leak current over 1 μA will not flow through the bit line BL unless the memory cells are overerased. In other words, unless the memory cells MC connected to the bit line BL are overerased, the value of the current flowing into the sense node N1 exceeds that of the current output from N1, and thus the potential at N1 is set at high.

On the other hand, if any of the memory cells MC connected to the bit line BL are overerased, the value of the current flowing from N1 exceeds that of the current flowing into the sense node N1, and thus the potential at N1 is set at low.

In the reference line, the other sense node N2 is set at a predetermined reference potential based on the load current generated by the load circuit 46 and the reference current generated by the reference current source 41. In this time, the differential amplifier 33 compares the potentials at the sense nodes N1 and N2, and outputs a high level signal if there is no overerased cell among the memory cells MC from which the stored data is erased. If any of the memory cells MC from which the stored data are erased are overerased, the differential amplifier outputs a low level signal. Accordingly, it can be checked on the basis of the output of the differential amplifier 33 (the sense amplifier circuit 19) whether or not the memory cells MC are erased are overerased.

In the ordinary data reading, the switch 40 is opened, and the switches 35, 37, and 42 are closed. Also in this time, the MOS transistors 32, 31, 45, and 44 are turned on, and the bit line BL is connected to the sense node N1 of the differential amplifier 33, and the reference line RL is connected to the other sense node N2. When the switch 40 is opened and the switch 37 is closed in this manner, the current output from the current mirror circuit 39 does not flow into the sense node N1. The sense node N1 is supplied with the load current output from the load current 38, instead of the current output from the current mirror circuit 39. Similarly, when the switch 35 is closed, the current generated by the leak current source 36 is supplied from the bit line BL. In this time, the switch 42 is also closed, and the current generated by the other leak current source 43 flows from the reference line RL.

In a read mode, the control gate (word line) of any one of the memory cells MC connected to the bit line BL is applied with a high level voltage for reading data, and the other control gates are applied with a low level voltage. If the memory cell, the control gate of which is applied with the reading high level voltage and which is rendered to be in a selected state, stores data "0" (the threshold voltage is set at a high level since the data writing is performed), a current of only 1 μA (which is generated by the leak current source 36 and is equivalent to the leak current) flows through the bit line. The current flowing from N1 is thus smaller than the current flowing into N1, and the potential at the sense node N1 is set at a high level. On the other hand, the memory cell MC which is set at a selected state stores "1" (the threshold voltage is low since the data has been erased or no data has been stored), the memory cell MC is turned on, and a cell current (a current of 20 μA, for example) flows therethrough. Accordingly, the current of 1 μA generated by the leak current source 36 and the cell current flow from the bit line BL. In this condition, the current flowing from N1 is smaller than the current flowing into N1, and thus the potential at the node N1 is set at a low level.

On the side of the reference line, the sense node N2 is set at a predetermined reference potential based on the load current generated by the load current circuit 46 and the reference current generated by the reference current source 41. The differential amplifier 33 compares the potentials of the nodes N1 and N2, and outputs the high level signal when the memory cell has data of "0", and outputs the low level signal when the memory cell has data of "1", thereby the stored data is read.

In the above-mentioned data reading, the current output from the leak current source 36 flows from the bit line BL, for the reason described below:

When the load circuit 38 operates, the maximum level of the signal flowing through the bit line BL can be represented as "$V_{BIAS}-V_{TH}$", which is the difference between the bias voltage $V_{BIAS}$ applied to the gate and the threshold voltage $V_{TH}$ of the MOS transistor 32 for the potential division. In other words, the amplitude of the signal flowing through the bit line BL is set to be smaller than this value "$V_{BIAS}-V_{TH}$".

However, the amplitude of the signal flowing through the bit line BL is set not to exceed the value "$V_{BIAS}-V_{TH}$" only when the flash EEPROM operates within the ordinary short period of cycle. When the period of cycle is long, a weak inverted current (i.e., the current which flows even when the voltage applied to the gate of the transistor does not exceed the threshold voltage of the transistor) flows through the MOS transistor 32, and the bit line BL has charge having the value over the expected value "$V_{BIAS}-V_{TH}$". In this case, the time required for discharging the charge of the bit line BL is longer than that of the case where the discharge time is set within the "$V_{BIAS}-V_{TH}$". In other words, the access time thereto is elongated.

In order to prevent the above-mentioned problem, the bit line BL is connected to the leak current source 36 in a read mode such that a predetermined value of the current constantly flows from the bit line BL, thereby the increase in the potential at the bit line BL can be prevented. Further, the leak current source 36 used both in a leak current check mode and in a read mode, and thus the circuit can be formed so compact.

As described above, the circuit according to the present embodiment is constituted such that, in a read mode, the load current generated by the load circuit 38 is supplied to the sense node N1 of the differential amplifier 33 in the sense amplifier circuit 19, and in a leak current check mode, the current necessary for performing the leak current check is supplied to the sense node N1 from the load circuit 38 through the current mirror circuit.

With this constitution, the amplitude of the signal of the bit line BL can be sufficiently increased without decreasing the capacity of the load on the side of the reference line, unlike the conventional device. The reading margin of the sense amplifier 19 in a leak current check mode can be thus increased than the conventional device.

Further, in the circuit according to the present embodiment, the resistance value on the side of the bit line needs not to be increased for performing the leak current check, unlike the conventional circuit. As a result, the increase of the chip area, which is caused by the increase of the resistance value on the side of the bit line, can be prevented. Further, the increase in the parasitic capacitance connected to the sense nodes of the differential amplifier can be prevented, thereby the deterioration of the characteristics of the alternate current in the ordinary data reading can be prevented.

Figures 5, 6:
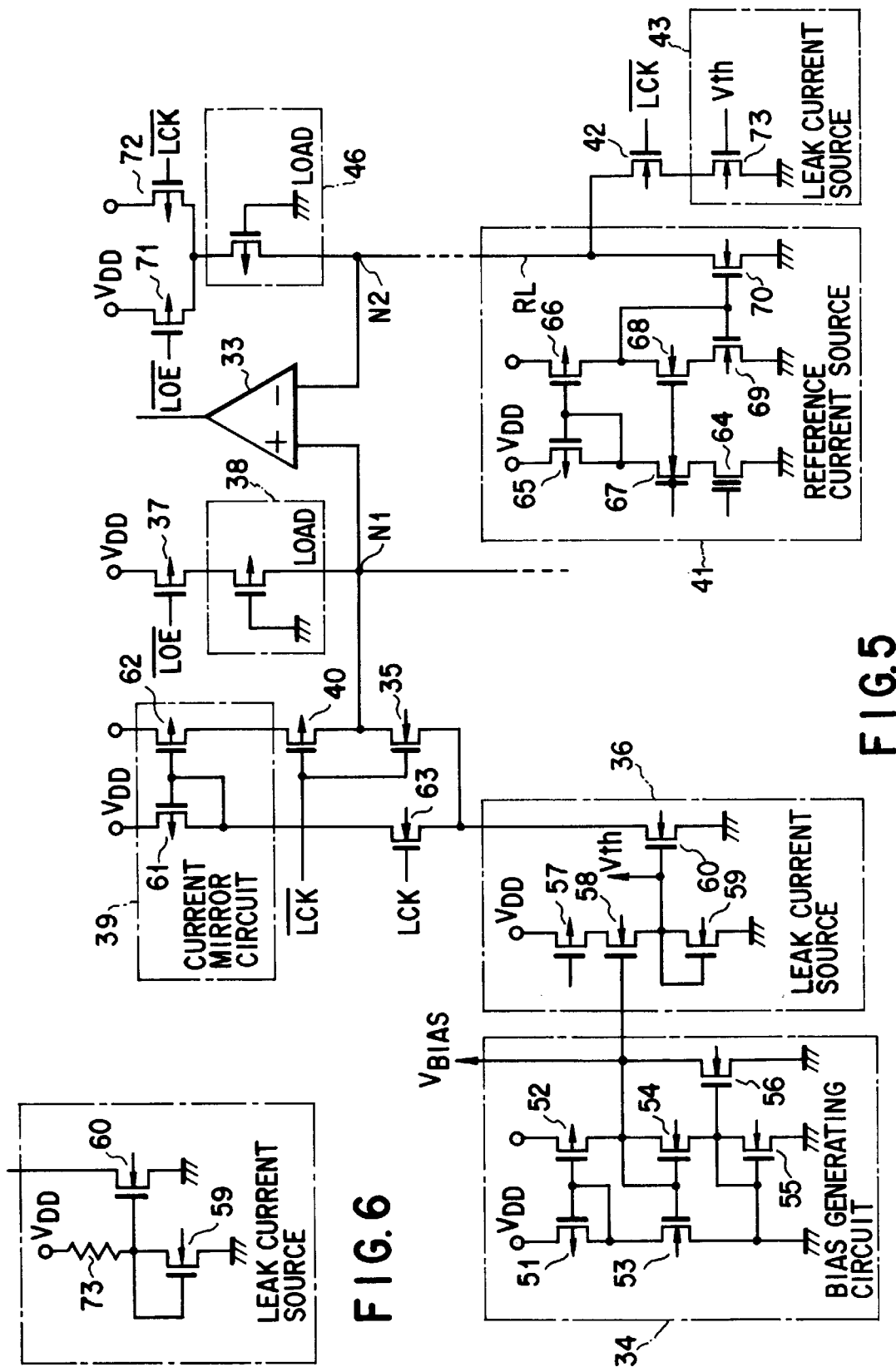
FIG. 5 is a circuit diagram showing the detailed constitution of the circuits in the circuit shown in FIG. 4.
FIG. 6 is a circuit diagram showing the constitution of another example of the leak current source in the circuit shown in FIG. 4.

FIG. 5 is a circuit diagram showing the detailed constitution of the circuits in the circuit shown in FIG. 4.

The bias generating circuit 34 for generating bias voltage VBIAS includes two p-channel type MOS transistors (hereinafter referred to as "p-MOSs") 51 and 52 and four n-channel type MOS transistors (hereinafter referred to as "n-MOSs") 53, 54, 55, and 56. This bias generating circuit 34 is a well-known type of circuit which generates the $2V_{THN}$ as the bias voltage $V_{BIAS}$ which is a sum of the threshold voltages $V_{THN}$ of two n-MOSs. The generated voltage $V_{BIAS}$ is supplied not only to the gates of the MOS transistors 32 and 45 (not shown in FIG.5), but also to the leak current source 36.

The leak current source 36 includes one p-MOS 57 and three n-MOSs 58 to 60. More specifically, the p-MOS 57 and three n-MOSs 58 to 60 are arranged in series via their sources and drains between the power supply voltage $V_{DD}$ and the ground. The gate of the p-MOS 57 is supplied with a control signal for activating the leak current source 36. The gate of the n-MOS 58 is applied with the bias voltage $V_{BIAS}$. The gate of the n-MOS 59 is connected to the drain thereof. The n-MOS 60 has a source connected to the ground and a gate connected to the gate of the n-MOS 59. The leak current is caused to flow into the drain of the n-MOS 60.

When the p-MOS 57 is turned on upon receiving a gate control signal, the leak current source 36 operates. By applying the bias voltage $V_{BIAS}$ as $2V_{THN}$ to the gate of the n-MOS 58, a voltage $V_{THN}$ is supplied to the source of the n-MOS 58 by the two n-MOSs 58 and 59. The voltage $V_{THN}$ is applied to the gate of the n-MOS 60, a very weak current of 1 $\mu$A, for example, flows through the n-MOS 60.

The switch 35 includes a n-MOS the gate of which is supplied with a control signal/LCK, and the switch 40 includes a p-MOS the gate of which is supplied with the control signal/LCK.

The switch 37 includes a p-MOS the gate of which is supplied with a control signal/LOE, and the load circuit 38 includes a p-MOS the gate of which is grounded.

The current mirror circuit 39 includes two p-MOSs 61 and 62. The p-MOSs 61 and 62 have sources respectively connected to the power supply voltage $V_{DD}$ and gates connected to each other. The common gate node connecting the gates is connected to the drain of the p-MOS 61 such that the drain of the p-MOS 61 functions as a current input node and the drain of the p-MOS 62 functions as a current output node. In this embodiment, the drain and source of the n-MOS 63 the gate of which is controlled by the control signal LCK are arranged between the current input node of the current mirror circuit 39 and the leak current source 36. The n-MOS 63 is turned off simultaneously with the switch 40 so that the current mirror circuit 39 is separated from the leak current source 36.

The reference current source 41 includes a non-volatile transistor 64, two p-MOSs 65 and 66, and four n-MOSs 67–70. The non-volatile transistor 64 has the same constitution as that of the memory cell MC, and has the threshold voltage at a low level similarly to the memory cell storing the data "1". The control gate of the non-volatile transistor 64 is supplied with a high level control signal. The gates of the n-MOSs 67 and 68 are supplied with a high level control signal. There flows through the non-volatile transistor 64 a current equivalent to the cell current of the memory cell MC which is turned on when it is selected. The current flowing through the non-volatile transistor 64 reaches the current mirror circuit including the p-MOS 65 and 66 and turns back to flow into the current mirror circuit including the n-MOSs 69 and 70 so that the current equivalent to the cell current of the memory cell flows from the reference line RL.

The switch 42 includes a n-MOS the gate of which is supplied with the control signal/LCK.

The leak current source 43 includes a n-MOS 73 the gate of which is applied with a voltage $V_{TH}$ obtained on the side of the drain of the n-MOS 58 in the leak current source 36.

The load circuit 46 includes a p-MOS the gate of which is grounded. In this embodiment, the p-MOSs 71 and 72 are arranged in parallel via their drains and sources between the load circuit 46 and the power supply voltage $V_{DD}$. The gate of the p-MOS 71 is supplied with the control signal/LOE, and the gate of the p-MOS 72 is supplied with the control signal/LCK. In the ordinary data reading, the control signal/LOE is set at a low level to turn the p-MOS 71 on, and thus the load current flows into the sense node N2 of the differential amplifier 33 through the load circuit 46. While, in a leak current check mode in the compaction process, the control signal/LCK is set at a low level, and the p-MOS 72 is turned on. Also in this case, the load current flows into the sense node N2 of the differential amplifier 33 through the load circuit 46.

FIG. 6 is a circuit diagram showing the constitution of another example of the leak current source 36 used in the circuit shown in FIG. 4.

In the example shown in FIG. 6, a resistance 73 is used instead of the p-MOS 57 and n-MOS 58 in the leak current source 36 shown in FIG. 5. Similarly to the example shown in FIG. 5, the threshold voltage $V_{THN}$ of the n-MOS 59 can be obtained on the side of the drain of the n-MOS 59. The threshold voltage $V_{THN}$ is applied to the gate of the n-MOS 60 such that the leak current flows through the n-MOS 60. Also in the case where the leak current source 36 shown in FIG. 6 is used, the gate of the n-MOS constituting the leak current source 43 is applied with the voltage $V_{THN}$ which can be obtained on the side of the drain of the n-MOS 59.

In the above-mentioned embodiment, the case where the current generated by the leak current circuit is used for the leak current check instead of the load current generated by the load circuit for the ordinary data reading is described. In one modification thereof, the threshold voltage of the memory cell can be monitored by supplying a fine current from the leak current source through the current mirror circuit, instead of the load current generated by the load circuit for the ordinary data reading.

More specifically, in monitoring the threshold voltage of the memory cell, the switch 37 is turned off to render the load circuit 38 for the ordinary data reading in a non-activated state, and the switch 40 is turned on to supply the fine current equivalent to that of the leak current source 36 to the sense node N1 of the differential amplifier 33 through the current mirror circuit 39.

While, the selective word line is set to be supplied with the voltage input from the outside (that is, a switch circuit is provided among the row decoder 13, the internal power supply/booster circuit 23 for supplying the operation power supply voltage, and the external voltage terminal, such that the selective word line can be supplied with the voltage input from the outside by the switching operation of the switching circuit). In this time, the level of the externally input voltage input into the external voltage terminal is varied to measure the level of the external voltage at the time when the output of the differential amplifier 33 is inverted. In this manner, since a cell current can be monitored using a fine current Level equivalent to the leak current source 36, the threshold voltage of the memory cell can be monitored more precisely as compared with the case where the load circuit 38 for reading data is used.

As described above, the present invention can provide a semiconductor integrated circuit capable of ensuring the large reading margin even in checking a leak current flowing through the memory cell, preventing the increase in total area of the circuit, and preventing the alternate current characteristics in the ordinary data reading from being adversely affected.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor integrated circuit device comprising:
   a memory cell including a non-volatile transistor having a control gate and a floating gate, data writing being performed in injecting electrons into the floating gate of the memory cell and data erasing being performed by discharging electrons from the floating gate, the memory cell indicating one of a conductive state and a non-conductive state in accordance with data stored in the memory cell when selected;
   a sensing circuit having a sense node, for sensing the data stored in the memory cell; and
   a constant current source for supplying to the sense node a current corresponding to a leak current flowing through the memory cell in a leak current check where the memory cell is set in a non-selected state and the leak current is detected by said sensing circuit.

2. A device according to claim 1, further comprising a circuit for causing to flow from the sense node the current corresponding to the leak current in a data reading where the memory cell is set in a selected state and the data stored in the memory cell is read.

3. A device according to claim 1, wherein the constant current source comprises a leak current source for generating the current corresponding to the leak current using an intermediate voltage obtained from a power supply voltage.

4. A device according to claim 3, wherein the leak current source comprises a MOS transistor for generating a drain current corresponding to the leak current when the intermediate voltage is applied to a gate of the MOS transistor.

5. A device according to claim 3, wherein the constant current source comprises a current mirror circuit for supplying to the sense node a current equivalent to the current generated from the leak current source in the leak current check.

6. A device according to claim 1, further comprising a circuit for preventing a load current used for reading data from being supplied to the sense node in the leak current check.

7. A device according to claim 1, further comprising a circuit for supplying to the sense node a current larger than the leak current as a load current used for reading data in data reading.

8. A device according to claim 1, wherein the leak current check is performed to check whether or not an overerased memory cell exists after data erasing for the memory cell.

9. A semiconductor integrated circuit device comprising:
   a memory cell indicating one of a conductive state and a non-conductive state in accordance with data stored in the memory cell when selected;
   a differential sensing circuit having first and second sense nodes, for sensing the data stored in the memory cell;
   a load circuit for supplying to the first sense node a load current used for reading data in a first mode;

a current source for supplying to the first sense node a current smaller than the load current in a second mode;

a circuit for causing to flow from the first sense node the current smaller than the load current in the first mode; and a circuit for setting the second sense node to a reference potential.

10. A device according to claim 9, wherein the circuit for setting the second sense node to the reference potential comprises:

a circuit for supplying a load current to the second sense node, and a reference current source for causing to flow from the second sense node a current corresponding to a cell current flowing through the memory cell selected in the first mode.

11. A device according to claim 9, wherein the memory cell is set in a selected state and the data stored in the memory cell is read in the first mode.

12. A device according to claim 11, wherein the memory cell is set in a non-selected state and the leak current is detected in the second mode.

13. A device according to claim 11, wherein a threshold voltage of the memory cell is monitored by detecting each cell current when a gate voltage of the memory cell is varied in the second mode.

14. A device according to claim 9, further comprising a current source for causing to flow from the second sense node a current which is substantially equal to the current smaller than the load current in the first mode.

15. A device according to claim 9, wherein the memory cell comprises a non-volatile transistor having a control gate and a floating gate, and data writing is performed by injecting electrons into the floating gate of the memory cell, and data erasing is performed by discharging electrons from the floating gate.

16. A device according to claim 9, wherein the current source comprises a leak current source for generating the current smaller than the load circuit and a current mirror circuit for supplying to the first sense node a current equivalent to the current generated from the leak current source.

17. A device according to claim 16, wherein the memory cell constitutes a memory cell array in which a plurality of the memory cells are arranged in matrix and drains of the memory cells arranged in the same column are coupled to one of a plurality of bit lines in common, and control gates of the memory cells arranged in the same row are coupled to one of a plurality of word lines in common.

18. A device according to claim 17, further comprising:

a word line driving circuit for selectively driving one of the word lines in the first mode, and setting all the word lines in a non-selected state in the second mode;

a first switch arranged between a current output node of the current mirror circuit and the first sense node of the differential sensing circuit and is controlled so as to be turned on in the second mode;

a second switch arranged between the leak current source and the first sense node and is controlled so as to be turned on in the first mode; and a third switch arranged in series to the load circuit used for reading data and is controlled so as to be turned on in the first mode.

19. A device according to claim 18, further comprising a fourth switch for selecting one of the bit lines to connect the selected bit line with the first sense node of the differential sensing circuit, the fourth switch comprises a MOS transistor as a column selector.

20. A device according to claim 18, wherein the first, second, and third switches each comprises a MOS transistor.

21. A device according to claim 16, wherein the leak current source comprises:

a bias generating circuit for generating a voltage corresponding to a threshold voltage of a n-channel type MOS transistor as a bias voltage; and a n-channel type MOS transistor having a gate applied with the bias voltage and a source being grounded.

22. A device according to claim 9, wherein it is checked whether or not an overerased memory cell exists after data erasing for the memory cell in the second mode.

23. A semiconductor integrated circuit device comprising:

a memory cell including a non-volatile transistor having a control gate and a floating gate, data writing being performed by injecting electrons into the floating gate of the memory cell and data erasing being performed by discharging electrons from the floating gate, the memory cell indicating one of a conductive state and a non-conductive state in accordance with data stored in the memory cell when selected;

a sensing circuit having a sense node, for sensing the data stored in the memory cell;

a MOS transistor used for dividing potential and connecting a bit line coupled to the memory cell with the sense node of the sensing circuit;

a leak current source for causing to flow from the sense node a leak current in data reading where the data stored in the memory cell is read; and a bias generating circuit for supplying a bias voltage to a gate of the MOS transistor and the leak current source.

24. A semiconductor integrated circuit device comprising:

a plurality of memory cells having control gates and layers for storing charges;

a first bit line, data stored to the memory cell being read thereto;

a second bit line, a reference voltage being applied thereto;

a plurality of word lines connected to the control gates of said plurality of memory cells, respectively;

a sensing circuit having a first node and a second node, said first node inputting a first current according to the data read from said first bit line and said second node inputting a second current according to the reference voltage transmitted by said second bit line;

a power supply node to which a power supply voltage is supplied;

a load circuit connected to said first node;

a first switch circuit connected between said load circuit and said power supply node;

a second switch circuit; and a constant current source, a predetermined current being supplied from the constant current source to said first bit line through said second switch circuit.

25. A device according to claim 24, wherein said first switch circuit electrically connects said power supply node with said load circuit when one of said plurality of memory cells is selected to read out data therefrom.

26. A device according to claim 25, wherein said second switch circuit electrically connects said power supply node with said load circuit when one of said plurality of memory cells is selected to read out data therefrom.

27. A device according to claim 24, wherein said constant current source generates the current using an intermediate voltage obtained from said power supply voltage.

28. A semiconductor integrated circuit device comprising:
- a plurality of memory cells having control gates and layers for storing charges;
- a first bit line, data stored to the memory cell being read thereto;
- a second bit line, a reference voltage being applied thereto;
- a plurality of word lines connected to the control gates of said plurality of memory cells, respectively;
- a sensing circuit having a first node and a second node, said first node inputting a first current according to the data read from said first bit line and said second node inputting a second current according to the reference voltage transmitted by said second bit line;
- a power supply node to which a power supply voltage is supplied;
- a load circuit connected to said first node;
- a first switch circuit connected between said load circuit and said power supply node;
- a second switch circuit;
- a constant current source, a predetermined current being supplied from the constant current source to said first bit line through said second switch circuit;
- a third switch circuit; and
- a current mirror circuit supplying a current according to the current supplied from said constant current source to said first node through said third switch circuit.

29. A device according to claim 28, wherein said third switch circuit electrically connects said current mirror circuit with said first node when none of said plurality of memory cells is selected to detect a leak current flowing through one of said plurality of memory cells.

30. A device according to claim 29, wherein said second switch circuit electrically disconnects said constant current source from said first bit line when none of said plurality of memory cells is selected to detect a leak current flowing through one of said plurality of memory cells.

31. A device according to claim 30, wherein said first switch circuit electrically disconnects said power supply node from said load circuit when none of said plurality of memory cells is selected to detect a leak current flowing through one of said plurality of memory cells.

32. A semiconductor integrated circuit device comprising:
- a plurality of memory cells having control gates and layers for storing charges;
- a first bit line, data stored to the memory cell being read thereto;
- a second bit lie, a reference voltage being applied thereto;
- a plurality of word lines connected to the control gates of said plurality of memory cells, respectively;
- a sensing circuit having a first node and a second node, read from said first bit line and said second node inputting a second current according to the reference voltage transmitted by said second bit line;
- a power supply node to which a power supply voltage is supplied;
- a load circuit connected to said first node;
- a first switch circuit connected between said load circuit and said power supply node;
- a second switch circuit;
- a constant current source, a predetermined current being supplied from the constant current source to said first bit line through said second switch circuit;
- a MOS transistor dividing potential between said first node and said first bit line; and
- a bias generating circuit, a bias voltage being supplied from the bias generating circuit to a gate of said MOS transistor.

33. A device according to claim 32, wherein said bias generating circuit also supplies the bias voltage to said constant current source.

34. A semiconductor integrated circuit device comprising:
- a memory cell including a non-volatile transistor having a control gate and a floating gate, data writing being performed in injecting electrons into the floating gate of the memory cell and data erasing being performed by discharging electrons from the floating date, the memory cell indicating one of a conductive state and a non-conductive state in accordance with data stored in the memory cell when selected;
- a differential sensing circuit having first and second sense nodes, for sensing the data stored in the memory cell;
- a load circuit for supplying to the first sense node a load current used for reading data in a first mode;
- a current source for supplying to the first sense node a current smaller than the load current in a second mode;
- a circuit for causing to flow from the first sense node the current smaller than the load current in the first mode; and
- a circuit for setting the second sense node to a reference potential.

* * * * *